United States Patent
Mirkarimi et al.

(10) Patent No.: US 6,692,976 B1
(45) Date of Patent: Feb. 17, 2004

(54) POST-ETCH CLEANING TREATMENT

(75) Inventors: Laura Wills Mirkarimi, Sunol, CA (US); Stephen R. Gilbert, San Francisco, CA (US); Guoqiang Xing, Plano, TX (US); Scott Summerfelt, Cupertino, CA (US); Tomoyuki Sakoda, San Jose, CA (US); Ted Moise, Los Altos, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 40 days.

(21) Appl. No.: 09/650,224

(22) Filed: Aug. 31, 2000

(51) Int. Cl.$^7$ .................. H01L 21/306; H01L 21/8239
(52) U.S. Cl. ........................ 438/3; 438/745; 438/750
(58) Field of Search ............... 438/4, 694, 704, 438/734, 745, 750, 754, FOR 125, 906, FOR 388, FOR 434, 3

(56) References Cited

U.S. PATENT DOCUMENTS

| | | | | |
|---|---|---|---|---|
| 3,099,609 A | * | 7/1963 | Katayose | ............ 205/172 |
| 5,635,463 A | * | 6/1997 | Muraoka | ............ 252/79.3 |
| 5,826,773 A | * | 10/1998 | Straemke | ............ 226/39 |
| 5,876,760 A | * | 3/1999 | Sasatani et al. | ............ 424/494 |
| 5,972,862 A | | 10/1999 | Torii et al. | |
| 5,989,948 A | * | 11/1999 | Vines et al. | ............ 438/216 |
| 6,127,282 A | * | 10/2000 | Lopatin | ............ 438/754 |
| 6,255,227 B1 | * | 7/2001 | Donaton et al. | ............ 438/745 |
| 6,294,027 B1 | * | 9/2001 | Li et al. | ............ 134/2 |
| 6,346,505 B1 | * | 2/2002 | Morita et al. | ............ 134/1 |
| 6,423,146 B1 | * | 7/2002 | Fukazawa | ............ 134/2 |
| 6,562,726 B1 | | 5/2003 | Torek et al. | |

OTHER PUBLICATIONS

Ghandhi, S., VLSI Fabrication Principles, John Wiley and Sons, pp. 517–519, 1983.*

* cited by examiner

Primary Examiner—George Fourson

(57) ABSTRACT

The present disclosure relates to a post-etch cleaning treatment for a semiconductor device such as a FeRAM. The treatment comprises providing an etchant comprising both a fluorine compound and a chlorine compound, and applying the etchant to the semiconductor device in a wet cleaning process.

5 Claims, 3 Drawing Sheets

POST-ETCH CLEANING TREATMENT

FIELD OF THE INVENTION

The present disclosure relates to post-etch cleaning treatments. More particularly, the present disclosure relates to post-etch cleaning treatments well-suited for removing damaged regions that form on the ferroelectric region of a FeRAM.

BACKGROUND OF THE INVENTION

Ferroelectric random access memory (FeRAM) is a nonvolatile, low power, memory that has the potential to replace electrically erasable, programmable read only memory (EEPROM), embedded Flash, embedded dynamic random access memory (DRAM), non-cache static random access memory (SRAM), and the like. FIG. 1 illustrates a conventional FeRAM capacitor stack. As shown in this figure, the FeRAM typically comprises a top electrode, a ferroelectric region, and a bottom electrode. The bottom electrode is normally formed on a tungsten plug 7 that passes through an interregion dielectric 6 that can, for example, be made of silicon dioxide ($SiO_2$) or silicon nitride ($Si_3N_4$). Typically, the top electrode is formed of two regions 1 and 2 that can be made of titanium aluminum nitride (TiAlN) and iridium (Ir), respectively. The bottom electrode is also typically formed of two regions 4 and 5 that can be made of Ir and TiAlN, respectively. The ferroelectric region 3 is disposed between the top and bottom electrodes in the capacitor stack. By way of example, the ferroelectric region 3 is composed of lead zirconate titanate (PZT).

FeRAM capacitor stacks are normally fabricated by individually growing each region of the stack, and then dry etching the stack to obtain a desired geometry. Often, the dry etching process used to fabricate FeRAM stacks forms chloride deposits 8 that surround the regions in the stack, and a damaged region 9 that is formed around the periphery of the ferroelectric region 3 as shown in FIG. 2. Although chloride deposits are easily removed and therefore typically not a concern, the damaged region can adversely affect FeRAM performance in that this region can create a bridge between the top and bottom electrodes of the capacitor stack that causes capacitor leakage. Even where capacitor leakage is not a problem, the damaged region can interfere with proper FeRAM performance because the region does not possess the desired ferroelectric properties. This phenomenon is particularly problematic where the capacitor stack is extremely small in that the smaller the cross-sectional area of each region, the larger the percentage of this area that the damaged region occupies.

Previously, damaged regions of PZT thin films were removed by combining wet cleaning and high temperature annealing. The post-etch anneal is a common practice in ferroelectrics that normally ensures good contact formation and removal of any hydroxides on the films. However, the effectiveness of the post-etch wet clean depends upon the specific PZT deposition and etch processes used. For example, PZT regions formed with sol-gel techniques are typically lead (Pb) rich. This indicates that a large fraction of the damaged region residue may be lead chloride ($PbCl_2$). Solutions comprising acetic acid, hydrofluoric acid, and ethanol in a volumetric ratio of 10:5:85 have been successfully used in etching such materials. However, metalorganic chemical vapor deposition (MOCVD) grown PZT tends to have a different composition in the as-grown state when compared to sol-gel films. Although highly acidic agents exist that can effectively remove the damaged regions of MOCVD PZT, such agents also tend to remove or damage the other components of the FeRAM stack. This can potentially degrade the operation of the FeRAM. Accordingly, it is desirable to have a post-etch cleaning treatment that is highly effective in removing damaged MOCVD PZT regions and that is highly selective such that the treatment will not harm the other components of the FeRAM stack.

SUMMARY OF THE INVENTION

The present disclosure relates to a post-etch cleaning treatment for a semiconductor device such as a FeRAM. The treatment comprises providing an etchant comprising both a fluorine compound and a chlorine compound, and applying the etchant to the semiconductor device in a wet cleaning process. Although other fluorine compounds can be used, the fluorine compound can comprise $NH_4F$ or HF. Although other chlorine compounds can be used, the chlorine compound can comprise HCl. Typically, the etchant is waterbased. In one preferred embodiment, the etchant has a fluorine compound:chlorine compound:water composition ranging from approximately 1:1.6:5000 to 1:1.6:1000.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
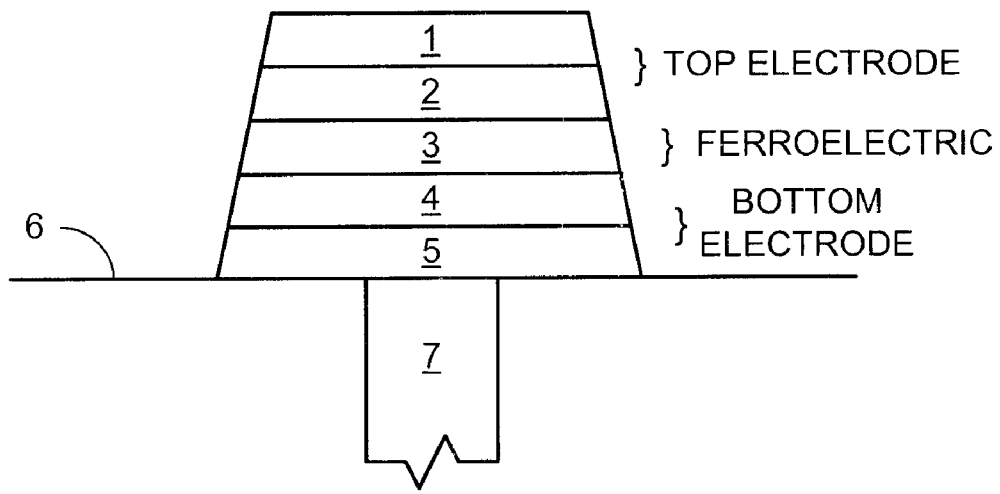
FIG. 1 is a schematic view of a conventional FeRAM capacitor stack.
Figure 2:
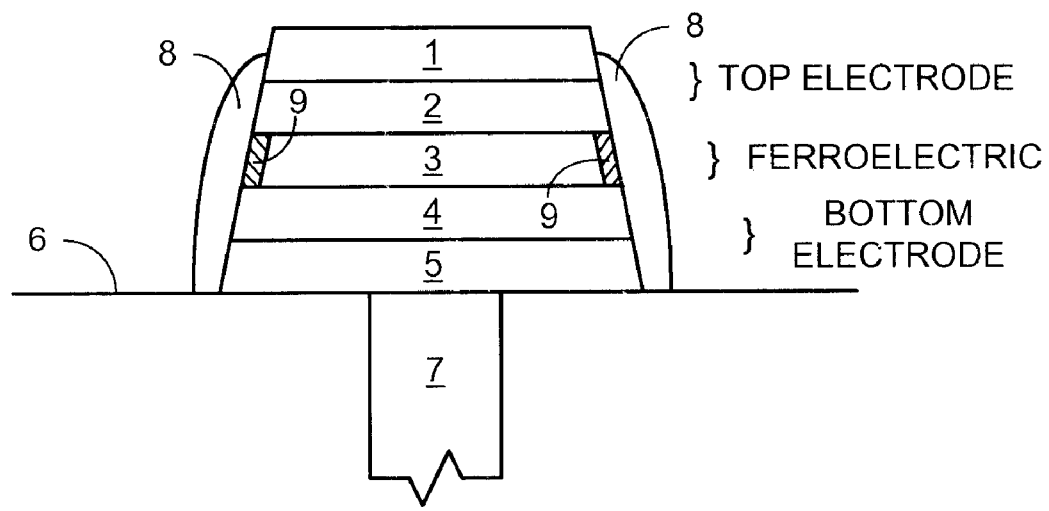
FIG. 2 is a schematic view of a conventional FeRAM capacitor stack illustrating the formation of chloride deposits and a damaged region created during a dry etching process.

An effective post-etch cleaning treatment preferably accomplishes several objectives. First, the cleaning chemistry will remove the damaged region at the perimeter of the PZT film without attacking other films that comprise the capacitor stack. The damaged region is expected to comprise compounds of lead (Pb), zirconium (Zr), titanium (Ti), chloride, other halide, and oxide while the other regions that are not to be effected may be composed of TiAlN, Ir, and $IrO_x$. Second, the cleaning treatment will remove particles and/or other residues from the outer surface of the stack that may have been created during the dry etching process. Furthermore, the cleaning chemistry will not remove any of the interregion dielectric that may be composed of, for example, $SiO_2$ or $Si_3N_4$. Finally, the cleaning chemistry preferably is effective at room temperature to simplify the cleaning process.

A wet cleaning process is preferred to accomplish these goals due to the selective nature of wet chemistry and the effectiveness of such processes in removing particulate matter. The wet cleaning process can comprise any known process including bath immersion with sonic vibration, spray processes, and spin rinse dry processes. Although these known wet cleaning processes are presently envisioned, it is to be appreciated that substantially any present or future wet cleaning process could be used since the effectiveness of the process is largely dependent upon the chemistry of the etchant used to remove the damaged region rather than the method in which it is applied.

Presently preferred for the etchant in the wet cleaning process is an etchant having a combination of a fluorine compound and a chlorine compound. The combination of a fluorine compound and a chlorine compound provides an aggressive wet etch for PbO, ZrO, and TiO containing compounds. For example, HF and HCl attack the Pb, $Zr_x$, $Ti_xO_3$ very slowly, e.g., at etch rates from approximately 3 to 8 nm/sec. When combined in similar concentrations, these acids are much more potent and PZT etch rates in excess of 70 nm/sec can be achieved. Most preferably, the fluorine compound and the chlorine compound are water soluble. By way of example, the fluorine compound can be selected from ammonium fluoride ($NH_4F$), calcium fluoride ($CaF_2$), and hydrogen fluoride (HF). By further way of example, the chlorine compound can be selected from ammonium chloride ($NH_4Cl$), hydrogen chloride (HCl), sodium chloride (NaCl), and sodium perchlorate ($NaClO_4$). In one embodiment, the preferred etchant comprises $NH_4F$ and HCl in combination. In another embodiment, the preferred etchant comprises HF and HCl in combination. Although these combinations are presently preferred, it is to be understood that alternative fluorine compounds and chlorine compounds could be combined to achieve advantageous results.

Tests were conducted to determine the effectiveness of $NH_4F$:HCl and HF:HCl etchants relative to known etchants (HF, HCl) used in the industry. Table I contains the results of the tests for various acid concentrations of the tested etchants and their effectiveness in etching PZT, $SiO_2$, and TiAlN. In the tests, planar films of PZT, $SiO_2$, and TiAlN were masked with a photoresist material such that a small portion of the films was exposed. The test samples were immersed in the various etchants listed in Table I for durations of 20 seconds to 10 minutes. The photoresist material next was removed, leaving behind a step formed by the etchant. The depth of this step was then measured with a profilometer.

As is apparent from Table I, tested concentrations for the $NH_4F$:HCl:$H_2O$ etchants ranged from 1:1.6:20 in its strongest (i.e., most acidic) state to 1:1.6:5000 in its weakest. The results contained in Table I illustrate that the strongest concentration of $NH_4F$:HCl:$H_2O$ was very aggressive in etching (i.e., removing) PZT, exhibiting an etch rate greater than 70 nm/sec, and was highly ineffective in etching $SiO_2$ and TiAlN,

TABLE I

Figure 3:
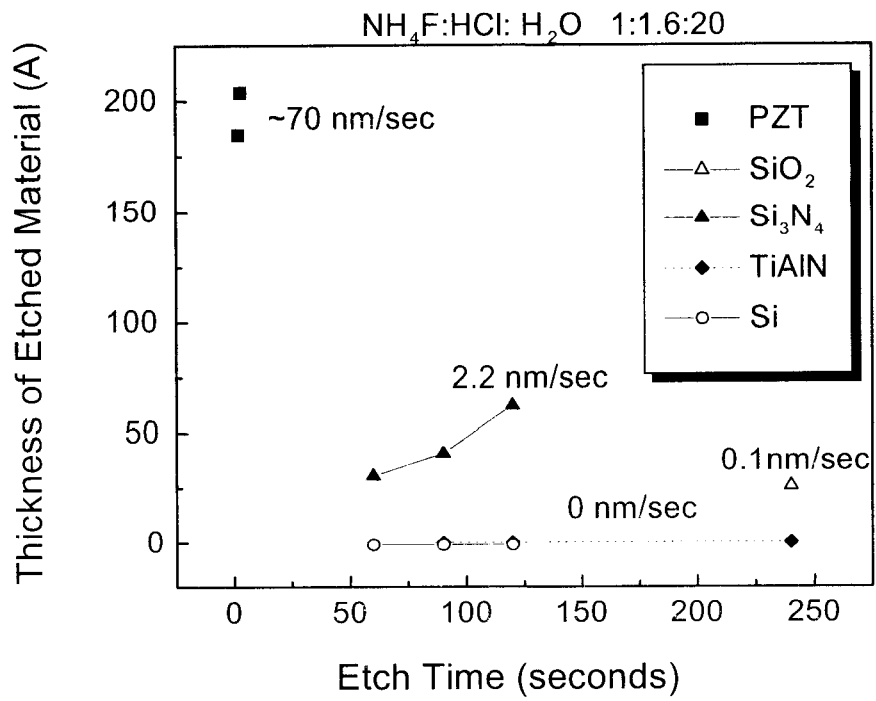
FIG. 3 is a plot which indicates the etch rates of an example preferred etchant with respect to various FeRAM materials.

| Etch Chemistry | Proportion of Constituents by Vol. | PZT Etch Rate (nm/sec) | SiO2 Etch Rate (nm/sec) | TiAlN Etch Rate (nm/sec) |
|---|---|---|---|---|
| $NH_4F$:HCl:$H_2O$ | 1:1.6:20 | >70 | 0.1 | 0 |
| $NH_4F$:HCl:$H_2O$ | 1:1.6:100 | 6 | 0 | 0 |
| $NH_4F$:HCl:$H_2O$ | 1:1.6:1000 | 2.5 | 0 | 0 |
| $NH_4F$:HCl:$H_2O$ | 1:1.6:5000 | 0.1 | 0 | 0 |
| HF:HCl:$H_2O$ | 1:1.6:100 | 27.1 | 0 | 0 |
| HF:HCl:$H_2O$ | 1:1.6:1000 | 3.3 | 0 | 0 |
| HF:$H_2O$ | 1:10 | 8.4 | 0 | 0 |
| HF:$H_2O$ | 1:100 | 1.0 | 0.04 | 0 |
| HF:$H_2O$ | 1:500 | 0.6 | 0 | 0 |
| HCl:$H_2O$ | 1:1 | 2.9 | 0 | 0 |
| HCl:$H_2O$ | 1:2 | 0.08 | 0 | 0 |
| HCl:$H_2O$ | 1:4 | ~0 | 0 | 0 | exhibiting negligible etch rates for these two materials. The plot of FIG. 3 graphically underscores this difference. In particular, FIG. 3 compares the etch rates of a 1:1.6:20 concentration of the $NH_4F$:HCl:$H_2O$ etchant for PZT, $SiO_2$, $Si_3N_4$, TiAlN, and Si. As is indicated in this figure, the NH4F:HCl:$H_2O$ etchant is much more effective at etching PZT materials than any of the other materials identified in the plots.

Figure 4:
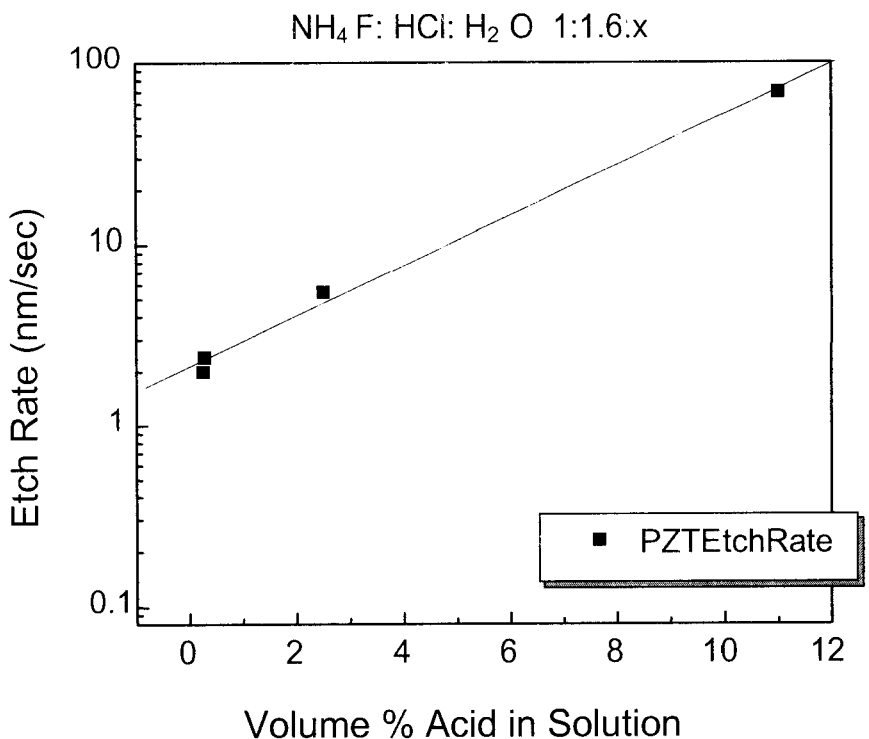
FIG. 4 is a plot which indicates the PZT etch rate for example preferred etchants having various acid concentrations.

With further reference to Table I, the PZT etching capacity of the NH4F:HCl:$H_2O$ etchant decreases substantially with decreasing acid concentrations. However, the tabulated results confirm that aggressive yet selective etch characteristics still are obtained at these lower acid concentrations. This indicates that the acid concentration of the etchant can be tailored so as to provide the desired etch rate for PZT. In the case of post-etch cleaning a FeRAM, the etch rate provided by the strongest tested $NH_4F$:HCl:$H_2O$ preparation may be unnecessary and, in fact, may be too great when the cross-sectional area of FeRAMs is so small. Accordingly, a lower concentration, for example one between 1:1.6:1000 and 1:1.6:5000, may be preferable to yield a PZT etch rate in the range of 2.5 to 0.1 nm/sec. FIG. 4 plots the PZT etch rate for $NH_4F$:HCl:$H_2O$ etchants having the various acid concentrations. As indicated in this plot, the etch rate decreases with the volume percentage of acid in solution following a semi-log plot. With the graphical information provided by FIG. 4, the acid concentration of the etchant, for example, NH4F:HCl:$H_2O$, can be specifically selected to achieve the desired etch rate.

As is further indicated by Table I, the HF:HCl:$H_2O$ etchant likewise exhibits etch characteristics that are highly selective between PZT on one hand and $SiO_2$ and TiAlN on the other hand. Again, the PZT etch rate decreases with decreasing acid concentration. However, the etch rates similarly indicate that the concentration of the etchant can be tailored to provide a desired rate of etching. Together, the tabulated results for the tested $NH_4F$:HCl:$H_2O$ and HF:HCl:$H_2O$ etchants reveal that the combination of a fluorine compound and a chorine compound results in a PZT etch rate and a selectivity that exceed those of the conventional etchants tested.

As will be understood by persons having ordinary skill in the art, the composition of the damaged region determines which etch chemistry works best to remove the damaged region and restore proper electrical performance of the stack.

For example, the use of chlorine as an etchant gas during the dry etching process normally results in the formation of metalchlorides such as lead chloride ($PbCl_2$), zirconium chloride ($ZrCl_4$), and titanium chloride ($TiCl_4$). However, of these, only $PbCl_2$ and $ZrCl_4$ are soluble in water at room temperature and normally can be removed with a water rinse process. Accordingly, it may be advantageous to combine the wet cleaning process described above with one or more water rinse processes.

Figure 5:
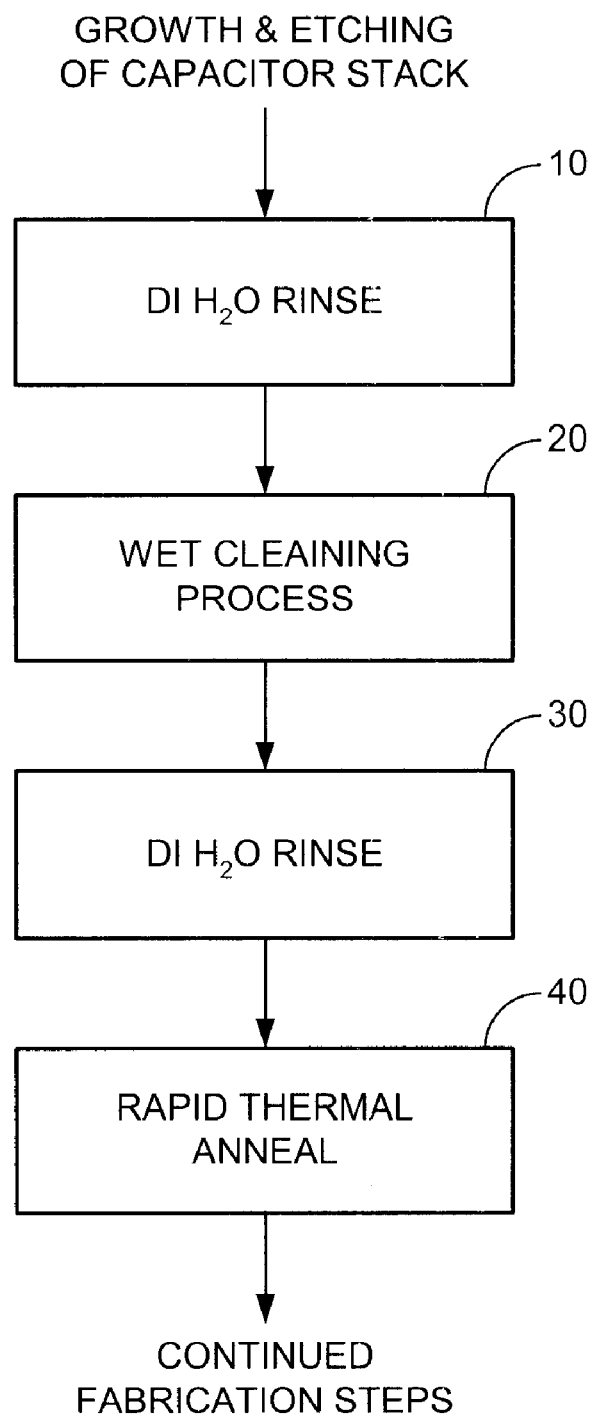
FIG. 5 is a flow diagram illustrating an example post-etch cleaning treatment sequence of the present invention.

FIG. 5 illustrates an example post-etch cleaning process that incorporates rinsing steps. It is to be understood that the steps shown in FIG. 5 constitute only a small portion of the process steps used to fabricate a capacitor stack such as that used in a FeRAM. As indicated in block 10, a deionized (DI) $H_2O$ rinse can be used to remove chloride deposits that have formed on the outer surface of the stack. After this rinse has been completed, a wet cleaning process using a fluorine compound/chlorine compound etchant such as those described above can be conducted to remove the damaged region that has formed at the perimeter of the ferroelectric region, as indicated in block 20. After this wet cleaning process has been performed, a further deionized $H_2O$ rinse, as indicated in block 30, may be desirable to remove any remaining etchants from the stack. Next, as indicated in block 40, the stack can be exposed to a rapid thermal anneal that may recover remaining damaged materials, if any, and that removes any hydroxide (OH) and $H_2O$ that remain within the stack. Once these steps have been performed, the remaining conventional fabrication steps can be performed to achieve the final product. Although a preliminary deionized $H_2O$ rinse step is shown in FIG. 5 and described above, it is noteworthy that, depending upon the concentration of the etchant used in the wet cleaning process 20, the water content in the etchant may be high enough to remove the chloride deposits from the stack. In such a case, the preliminary rinse of block 10 may be unnecessary.

Experiments were conducted on Ir/IrOx/PZT/Ir capacitors to evaluate the leakage current following a low temperature dry etch process in $O_2$:$Cl_2$:$CF_4$ gas mixtures to test the effect of the post-etch cleaning treatment shown in FIG. 5 on the electrical properties of a FeRAM capacitor stack. The PZT region of the stack was deposited by MOCVD and it was assumed that ~15 nm of the PZT layer was damaged. In conducting the test, etched capacitors of equivalent geometries were rinsed with water and then etched in a variety of chemistries for durations ranging from 20 seconds to 2 minutes depending upon the measured etch rates of the planar PZT films shown in Table II. Following the wet cleaning process, each stack was subjected to a rapid thermal anneal at 600° C. in $N_2$ for 10 minutes. Leakage current, J, was measured using top electrodes with several geometries, however the top electrode area was maintained at a constant $1.4 \times 10^{-4}$ $cm^2$ or $3.2 \times 10^{-4}$ $cm^2$ depending upon the stack geometry. The results of these experiments are contained in Table II.

As indicated in Table II, the leakage current J for fluorine compound/chlorine compound etchants was less than that for the HF etchant and HCl etchants. Moreover, the fluorine compound/chlorine compound etchants did not cause separation of the stack regions as occurred with the HF and HCl etchants (indicated with an asterisk). This separation resulted from the HF and HCl etchants aggressively etching the capacitor stacks at the intersections of the ferroelectric region and the top and/or bottom electrodes. Accordingly, the fluorine compound/chlorine compound etchants of the present invention effectively remove the damaged region formed on FeRAM capacitor stacks with current leakage results superior to those obtained with conventional etchants.

While particular embodiments of the invention have been disclosed in detail in the foregoing description and drawings for purposes of example, it will be understood by those skilled in the art that variations and modifications thereof can be made without departing from the scope of the invention as set forth in the following claims.

TABLE II

| Cleaning Treatment | Solution Ratios/Time | Device Dimensions ($\mu m$) | J(1.0 V) ($A/cm^2$) | J(−1.0 V) ($A/cm^2$) | J(2.0 V) ($A/cm^2$) | J(−2.0 V) ($A/cm^2$) |
|---|---|---|---|---|---|---|
| None | n/a | 100 $\mu m$ × 100 $\mu m$ | $4.1 \times 10^{-7}$ | $7.0 \times 10^{-7}$ | $7.1 \times 10^{-4}$ | $4.3 \times 10^{-4}$ |
| | | 1 $\mu m$ × 1 $\mu m$ | $2.3 \times 10^{-6}$ | $8.0 \times 10^{-7}$ | $5.0 \times 10^{-4}$ | $3.2 \times 10^{-3}$ |
| | | 0.8 $\mu m$ × 0.8 $\mu m$ | $1.7 \times 10^{-4}$ | $3.8 \times 10^{-5}$ | $1.1 \times 10^{-3}$ | $3.1 \times 10^{-3}$ |
| | | 0.6 $\mu m$ × 0.6 $\mu m$ | short | short | short | short |
| | | 0.32 $\mu m$ × 0.48 $\mu m$ | short | short | short | short |
| DI $H_2O$ Only | (20 min) | 100 $\mu m$ × 100 $\mu m$ | $5.5 \times 10^{-7}$ | $4.7 \times 10^{-7}$ | $1.3 \times 10^{-5}$ | $3.9 \times 10^{-5}$ |
| | | 1 $\mu m$ × 1 $\mu m$ | $3.0 \times 10^{-6}$ | $1.4 \times 10^{-6}$ | $8.5 \times 10^{-5}$ | $2.0 \times 10^{-3}$ |
| | | 0.8 $\mu m$ × 0.8 $\mu m$ | $7.8 \times 10^{-4}$ | $7.0 \times 10^{-4}$ | $3.3 \times 10^{-3}$ | $4.3 \times 10^{-3}$ |
| | | 0.6 $\mu m$ × 0.6 $\mu m$ | short | short | short | short |
| | | 0.32 $\mu m$ × 0.48 $\mu m$ | short | short | short | short |
| $NH_4F$: HCl:$H_2O$ DI $H_2O$ | 1:1.6:5000 (120 sec) (20 min) | 100 $\mu m$ × 100 $\mu m$ | $4.1 \times 10^{-7}$ | $4.8 \times 10^{-7}$ | $1.6 \times 10^{-5}$ | $4.3 \times 10^{-4}$ |
| | | 1 $\mu m$ × 1 $\mu m$ | $2.9 \times 10^{-6}$ | $8.7 10^{-7}$ | $1.5 \times 10^{-4}$ | $2.7 \times 10^{-3}$ |
| | | 0.8 $\mu m$ × 0.8 $\mu m$ | $4.6 \times 10^{-4}$ | $3.5 \times 10^{-4}$ | $2.4 \times 10^{-3}$ | $4.8 \times 10^{-3}$ |
| | | 0.6 $\mu m$ × 0.6 $\mu m$ | short | short | short | short |
| | | 0.32 $\mu m$ × 0.48 $\mu m$ | short | short | short | short |
| $NH_4F$: HCl:$H_2O$ DI $H_2O$ | 1:1.6:5000 (120 sec) (20 min) | 100 $\mu m$ × 100 $\mu m$ | $6.4 \times 10^{-7}$ | $5.2 \times 10^{-7}$ | $1.4 \times 10^{-5}$ | $3.4 \times 10^{-4}$ |
| | | 1 $\mu m$ × 1 $\mu m$ | $4.3 \times 10^{-6}$ | $1.7 \times 10^{-6}$ | $1.0 \times 10^{-4}$ | $1.5 \times 10^{-3}$ |
| | | 0.8 $\mu m$ × 0.8 $\mu m$ | $3.3 \times 10^{-4}$ | $3.1 \times 10^{-4}$ | $1.7 \times 10^{-3}$ | $2.8 \times 10^{-3}$ |
| | | 0.6 $\mu m$ × 0.6 $\mu m$ | short | short | short | short |
| | | 0.32 $\mu m$ × 0.48 $\mu m$ | short | short | short | short |

TABLE II-continued

| Cleaning Treatment | Solution Ratios/Time | Device Dimensions ($\mu$m) | J(1.0 V) (A/cm$^2$) | J(−1.0 V) (A/cm$^2$) | J(2.0 V) (A/cm$^2$) | J(−2.0 V) (A/cm$^2$) |
|---|---|---|---|---|---|---|
| HCl:H$_2$O DI H$_2$O | 1:2 (120 sec) (20 min) | 100 $\mu$m × 100 $\mu$m<br>1 $\mu$m × 1 $\mu$m<br>0.8 $\mu$m × 0.8 $\mu$m<br>0.6 $\mu$m × 0.6 $\mu$m<br>0.32 $\mu$m × 0.48 $\mu$m | $1.0 \times 10^{-7}$<br>*<br>*<br>*<br>* | —<br>*<br>*<br>*<br>* | —<br>*<br>*<br>*<br>* | —<br>*<br>*<br>*<br>* |
| HF:H$_2$O DI H$_2$O | 1:500 (30 sec) (20 min) | 100 $\mu$m × 100 $\mu$m<br>1 $\mu$m × 1 $\mu$m<br>0.8 $\mu$m × 0.8 $\mu$m<br>0.6 $\mu$m × 0.6 $\mu$m<br>0.32 $\mu$m × 0.48 $\mu$m | $1.0 \times 10^{-7}$<br>*<br>*<br>*<br>* | —<br>*<br>*<br>*<br>* | —<br>*<br>*<br>*<br>* | —<br>*<br>*<br>*<br>* |

* = Wet clean caused regions to separate.

What is claimed is:

1. A process comprising:

providing an etchant consisting essentially of both a fluorine compound and a chlorine compound, where the fluorine compound is selected from a group consisting of NH$_4$F and HF, wherein the chlorine compound is selected from a group consisting of NH$_4$Cl and HCl wherein the etchant includes either NH$_4$F or NH$_4$Cl; and applying the etchant to a semiconductor device.

2. The process of claim 1, wherein the fluorine compound is NH$_4$F.

3. The process of claim 1, wherein the fluorine compound is HF.

4. The process of claim 1, wherein the chlorine compound is HCl.

5. The process of claim 1, wherein the device is a FeRAM and the method additionally comprises forming the device by MOCVD.

* * * * *

UNITED STATES PATENT AND TRADEMARK OFFICE
CERTIFICATE OF CORRECTION

PATENT NO. : 6,692,976 B1
DATED : February 17, 2004
INVENTOR(S) : Mirkarimi, Laura Wills It is certified that error appears in the above-identified patent and that said Letters Patent is hereby corrected as shown below:

Title page,
Item [75], Assignees: please remove "Stephen R. Gilbert, Guogiang Xing, Scott Summerfelt, Tomoyuki Sakota, and Ted Moise" as inventors on this application.

Signed and Sealed this

Sixth Day of July, 2004

JON W. DUDAS
*Acting Director of the United States Patent and Trademark Office*